United States Patent [19]

Wight et al.

[11] 4,075,555
[45] Feb. 21, 1978

[54] ELECTRONIC PHASE COMPARISON APPARATUS FOR THE REMOTE MEASUREMENT OF LAYER THICKNESS

[75] Inventors: James S. Wight; Walter J. Chudobiak, both of Ottawa, Canada; Vassilios Makios, Patras, Greece

[73] Assignee: Canadian Patents and Development Limited, Ottawa, Canada

[21] Appl. No.: 781,506

[22] Filed: Mar. 25, 1977

[51] Int. Cl.² .......................................... G01R 27/04
[52] U.S. Cl. ............................................. 324/58.5 R
[58] Field of Search ................. 324/58.5 R, 58.5 A, 324/58.5 B, 58 R

[56] References Cited

U.S. PATENT DOCUMENTS

| 3,093,825 | 6/1963 | Allen | 324/58.5 B X |
| 3,430,139 | 2/1969 | Schluter | 324/58.5 A |

FOREIGN PATENT DOCUMENTS

| 993,050 | 5/1965 | United Kingdom | 324/58.5 R |
| 1,251,362 | 10/1971 | United Kingdom | 324/58.5 B |
| 441,525 | 12/1974 | U.S.S.R. | 324/58.5 A |

Primary Examiner—Stanley T. Krawczewicz
Attorney, Agent, or Firm—Edward Rymek

[57] ABSTRACT

A continuous wave, phase measurement system which provides at least an order of magnitude improvement in accuracy over modulated carrier systems is disclosed for the determination of the thicknesses of layered targets consisting of a known number of dielectric layers, each of a known maximum thickness. This system uses related frequencies such as the fundamental and its harmonics to establish a multi-harmonic coherence relationship whereby a homodyne phase reference between harmonics can be conserved and information extracted from just the received and not the transmitted signals. Consequently doppler effects due to motion between the target and the apparatus, as well as severe local oscillator stability and drift limitations are avoided, and thus this system can measure remote target parameters by interferometric techniques without the distance being a constraint.

8 Claims, 10 Drawing Figures

ELECTRONIC PHASE COMPARISON APPARATUS FOR THE REMOTE MEASUREMENT OF LAYER THICKNESS

BACKGROUND OF THE INVENTION

The invention is directed to high accuracy thickness measurements and in particular to a multi-frequency electronic apparatus for remotely measuring the thickness of dielectric layers.

Conventional electronic apparatus used for the determination of the thickness of layers such as industrial films and sheets, or sea ice layers encounter significant problems arising from conflicts between desired accuracy requirements and realizable bandwidth capabilities.

Experimental electromagnetic measurements for sea ice indicate that losses are minimum over the HF and VHF spectrum. Consequently, a successful remote sensing system for sea ice should operate in these frequency bands. However, the maximum accuracy achieved for a modulated carrier apparatus operating in the VHF band, say under 200 MHz, is of the order of 1 ft. This is unsatisfactory for many important applications such as the clearing of ice blockage in shipping lanes or the determination of the thickness of ice landing-strips and roadways for Arctic exploration.

A similar problem exists in the remote production line measurements of industrial film thicknesses such as oil, and industrial sheet thicknesses such as plexiglass or building materials. The large bandwidths and high centre frequencies required by conventional electronic systems for satisfactory accuracy are prohibitive due to high cost and stringent component requirements. A reduction in centre frequency and bandwidth would alleviate this problem; however, the accuracy attainable would become unsatisfactory.

It is apparent that a reduction in centre frequency and bandwidth is required while maintaining as high an accuracy as possible.

The operation of systems such as homodyne measurement systems, interferometers, holographic systems and synthetic-aperture radars is dependent on the principle of coherency which refers to the presence of an analytic relationship between the phases of diverse wave at different points in time. This principle is discussed by M. J. Beran and G. B. Parrent in the text "Theory of Partial Coherence", Prentice-Hall, New Jersey, 1964. Generally, coherency is referred to in the form of spatial coherency, i.e. the conservation of a phase reference between several spatially distributed and differentially delayed signals of the same frequency. Two fundamental properties of this principle, the maximum phase resolution obtainable in the presence of noise and the maximum differential time delay tolerable between the signals, determine important engineering constraints for any spatial interferometric application.

The maximum phase accuracy which can be achieved between two spatially isolated signals for a typical phase measurement system in which a low power, noise embedded signal is received from a target and is compared with a high power, noise free transmitter signal, can be derived to be:

$$\phi_o = \frac{1.6}{\sqrt{A^2/N_o BW}} \quad (1)$$

where
- $\phi_0$ = phase error which is exceeded only 1% of the time;
- $A$ = amplitude of the received signal;
- $N_0$ = the one-sided power spectral density of the noise; and
- $BW$ = effective bandwidth of the bandpass filter.

This equation allows a comparison of the spatial accuracies which can be obtained for a conventional modulated carrier (MC) electronic measurement system and a continuous wave (CW) phase measurement apparatus.

For a continuous wave system operating with a frequency $f$, the relation between phase and delay is:

$$\tau = \frac{1}{f} \cdot \frac{\phi}{2\pi} \quad (2)$$

Since $$f = \frac{1}{4T} \quad (3)$$

where T is the half-power width of the continuous wave sinusoid, Eqn. (2) becomes:

$$\tau = \frac{2}{\pi} T \phi \quad (4)$$

With this, Eqn. (1) gives:

$$\tau_o = \frac{T}{\sqrt{A^2/N_o BW}} \quad (5)$$

As a result, the required signal to noise ratio necessary to achieve a desired error in delay for a continuous wave system operating at a specified half-power width can be found.

For a conventional modulated carrier system, the broadband noise at the input of the system's front end matched filter is changed at the output into narrow band noise fluctuating at the same average frequency as the filter response. The filter response can then be represented mathematically by a pure sinusoid of the same amplitude and half-power width as the central peak of the system response. The noise will now manifest itself predominantly as a phase shift of this sinusoid and Eqn. (5) can be used to obtain a delay error. If the amplitude and half-power width of the central peak is matched to the sinusoid of the continuous wave system response, then the ratio of the errors in delay given by Eqn. (5) can be written:

$$\frac{\tau_o CW}{\tau_o MC} = \sqrt{\frac{BN_{CW}}{BW_{MC}}} \quad (6)$$

This relationship compares the resolution achievable for the two types of systems and is dependent only on the ratio of the bandwidths of the two front-end filters. Now, for an MC system, the bandwidth of the matched filter is approximately equal to the inverse of the half-power width of the signal pulse:

$$BW_{MC} = 1/T \quad (7)$$

For a CW system, bandpass filters with 0.04% to 4% relative bandwidths are easily constructed. Using Eqn. (3); this gives:

$$0.0001/T < BW_{CW} < 0.01/T \quad (8)$$

Substituting Eqn. (7) and (8), Eqn. (6) yields:

$$.01 < \frac{T_{oCW}}{T_{oMC}} < .1 \quad (9)$$

This equation demonstrates that one or two orders of magnitude improvement in range precision can be achieved for the CW system as compared to the MC system. Alternatively, one or two orders of magnitude reduction in centre frequency becomes possible for the CW system while maintaining the high resolution capability of the MC system.

The second fundamental property of coherency, the maximum differential time delay which can be tolerated between the separate signals without disturbing their analytical phase relationship, can be shown to be dependent on the effective bandwidth of the AM and FM noise associated with the signals. It has been determined that the maximum differential time delay is given by the autocorrelation interval of the noise:

$$R_n(\tau) \approx 1/BW \quad (10)$$

where $BW$ = bandwidth of the noise.

Since this interval is inversely related to the bandwidth of the modulating noise, a large difference in signal time delays and consequently in signal path lengths can be tolerated for noise-free oscillating sources.

The synchronous detection process which provides the time reference in a CW system can be easily implemented by a comparison of the phases of the transmitted and returned signals. This technique is commonly used to determine the distance to a single, stationary target in surveying applications. However, three limitations of this comparison technique exist in situations where the distance to the target can be large and varying as in remote sensing applications.

The first limitation arises in situations where the distance to the target is larger than one-half of the product of the speed of light and the signal autocorrelation interval, $1 > \nu R_s(\tau)/2$. For such large distances, the transmitted and received signals will begin to lose their coherency and synchronous detection becomes impossible. This situation may arise in environmental monorating from the upper atmosphere or space.

A second and more severe limitation also arises from the large difference in path lengths between the transmitted reference signal and the received signal. The phase detection networks form high Q resonant circuits and consequently any local oscillator frequency drift will completely obscure initial phase alignments. This becomes difficult to avoid in environmental testing due to the extreme termperature differentials encountered.

The third and most severe limitation arises from motion between the instrument and the target during the finite time integration interval T used in the synchronous detection provess to improve sensitivity. Relative motion, which is impossible to avoid during continuous profiling experiments, will completely disrupt the analyticity of the detected phases.

SUMMARY OF THE INVENTION

It is therefore an object of this invention to provide a CW multi-frequency remote sensing apparatus for dielectric thickness measurements having greater accuracy than conventional modulated carrier apparatus.

It is a further object of this invention to provide a CW multi-frequency remote sensing apparatus for dielectric thickness measurements in which the phase resolution constraints due to noise and differential time delay are relaxed.

It is another object of this invention to provide a CW multi-frequency remote sensing apparatus for dielectric thickness measurements in which the signal path length between the transmitter, the dielectric target and the receiver does not affect the resolution of the measurements.

It is a further object of this invention to provide a CW multi-frequency remote sensing apparatus for dielectric thickness measurements in which relative motion between the dielectric target and the receiver does not affect the resolution of the measurement.

These and other objects are achieved in a CW multi-frequency remote sensing apparatus for the thickness measurement of $n$ layers in a dielectric material target where $n \geq 1$. The apparatus includes a transmitter having $n + 1$ single frequency channels for directing $n + 1$ related frequency signals to the target, and a receiver for receiving the $n + 1$ signals from the target. The receiver includes a first circuit for converting the signals to a common frequency and a second circuit for comparing the phase of pairs of the converted signals to determine the thicknesses $l$ of the $n$ layers as a function of the phase differences, where $l < \lambda/4$, $\lambda$ being the shortest wavelength of the difference frequency between the related $n + 1$ signals. The receiver may further include a third circuit for detecting the amplitudes of the received signals for determining the thicknesses $l$ of each of the $n$ layers as a function of the amplitude ratios of the received signals where $l < \lambda/2$.

DESCRIPTION OF THE PREFERRED EMBODIMENT

Figure 1:
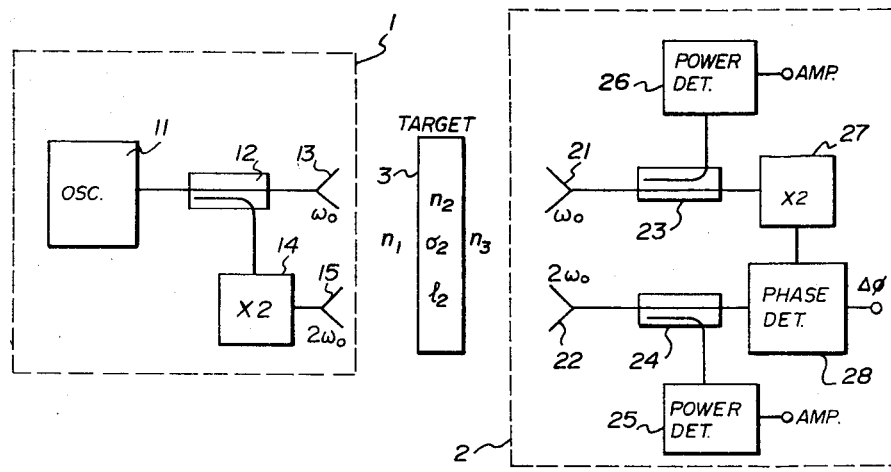
FIG. 1 schematically illustrates a bi-frequency remote sensing apparatus for transmission thickness measurement of a single layer target in accordance with the present invention.

As described above, phase reference can be conserved between signals of the same frequency propagating along separate paths in spatial coherency applications, however, it has been determined that the phase reference can also be conserved between signals of separate frequencies propagating along the same path. This new reference called the dispersive-phase reference is defined as the phase of the signal at the higher frequency minus the phase of the signal at the lower frequency multiplied by the frequency ratio.

Harmonic coherency then is the conservaton of a dispersive-phase reference between several, harmonically distributed and differentially delayed signals, propagating along the same spatial channel. As for spatialcoherency the two properties for harmonic coherency which determine important engineering constraints, are the maximum dispersive phase accuracy and maximum differential time delay achievable.

The maximum dispersive-phase accuracy which can be achieved between two harmonically isolated, noise embedded signals can be derived by assuming that the signals both have an amplitude A which is large compared to the noise. Using the equation $$\phi(t) \approx \tan\phi(t) \approx y(t)/A \tag{11}$$

the random variables for the time-suppressed phase of each CW signal can be written:

$$\Phi_1 \approx \frac{Y_1}{A} \tag{12}$$

$$\Phi_2 \approx \frac{Y_2}{A} \tag{13}$$

where $y(t)$ is the phase quadrature component of the noise. Assuming that $Y_1$ and $Y_2$ are independent, Gaussian and have zero mean and variance $\sigma_\phi^2$, the probability density functions are:

$$f_{\Phi_1}(\phi) = \frac{1}{\sqrt{2\pi\sigma_\phi^2}} e^{-\phi_1^2/2\sigma_\phi^2} \tag{14}$$

and $$f_{\Phi_2}(\phi) = \frac{1}{\sqrt{2\pi\sigma_\phi^2}} e^{-\phi_2^2/2\sigma_\phi^2} \tag{15}$$

Therefore, the characteristic functions are:

$$\theta_1(\omega) = E\{e^{j\omega\Phi_1}\} = e^{-\sigma_\phi^2\omega^2/2} \tag{16}$$

and $$\theta_2(\omega) = E\{e^{j\omega\Phi_2}\} = e^{-\sigma_\phi^2\omega^2/2} \tag{17}$$

The random variable for the dispersive-phase between the two CW signals becomes:

$$\Phi = \Phi_2 - \Phi_3 \tag{18}$$

where $$\Phi_3 = R\Phi_1 \tag{19}$$

$$f_{\Phi_3}(\phi) = \frac{1}{|R|} f_{\Phi_1}\left(\frac{\phi}{R}\right) \tag{20}$$

and R is the frequency ratio of the two signals. Now, the probability distribution function for $\phi$ is defined as:

$$F_\Phi(\phi) = P\{\Phi < \phi\} = P\{(\Phi_2, \Phi_3) \in D_\Phi\} \tag{21}$$

-continued $$= \iint_{D_\Phi} f_{\Phi_2\Phi_3}(\phi_2, \phi_3) d\phi_2 d\phi_3$$

and therefore, using Eqn. (18), Eqn. (21) yields:

$$F_\Phi(\phi) = \int_{-\infty}^{\infty} \int_{-\infty}^{\phi+\phi_3} f_{\Phi_2\Phi_3}(\phi_2, \phi_3) d\phi_2 d\phi_3 \tag{22}$$

Differentiating with respect to $\phi_2$, Eqn. (22) becomes:

$$f_\Phi(\phi) = \int_{-\infty}^{\infty} f_{\Phi_2\Phi_3}(\phi - \phi_3, \phi_3) d\phi_3 \tag{23}$$

But $\Phi_2$ and $\Phi_3$ are statistically independent since $Y_1$ and $Y_2$ are independent. Therefore, $$f_\Phi(\phi) = \int_{-\infty}^{\infty} f_{\Phi_2}(\phi - \phi_3) f_{\Phi_3}(\phi_3) d\phi_3 \tag{24}$$

Using Eqn. (20), Eqn. (24) becomes:

$$f_\Phi(\phi) = \frac{1}{|R|} \int_{-\infty}^{\infty} f_{\Phi_2}(\phi - \phi_3) f_{\Phi_1}\left(\frac{\phi_3}{R}\right) d\phi_3 \tag{25}$$

Fourier transforming Eqn. (25) and using Eqns. (16) and (17) gives:

$$\theta(\omega) = \theta_1(\omega)\theta_2(R\omega) = e^{-(R+1)\sigma_\phi^2\omega^2/2} \tag{26}$$

Consequently;

$$f_\Phi(\phi) = \frac{1}{\sqrt{4\pi(R+1)\sigma_\phi^2}} e^{-\phi/2(R+1)\sigma_\phi^2} \tag{27}$$

and the variance of the dispersive-phase $\sigma^2$ equals $$\sigma^2 = (R+1)\sigma_\phi^2 \tag{28}$$

Now, the statistical variance of the time suppressed phase $\sigma_\phi^2$ of either signal is:

$$\sigma_\phi^2 = \frac{1}{A^2} \sigma_y^2 \tag{29}$$

where $\sigma_y^2$ is the variance of the phase quadrature noise component. Using Rice's theorem, $\sigma_x^2 = \sigma_y^2 = \sigma_N^2$, and Eqn. (29) becomes:

$$\sigma_\phi^2 = \frac{1}{A^2} \sigma_N^2 \tag{30}$$

The average power of the narrow band noise is:

$$\sigma_N^2 = \int_0^\infty N_o |\psi(f)|^2 df \tag{31}$$

$$= N_o BW \tag{32}$$

where $N_0$ is the one-sided power spectral density of the noise, $\Psi(f)$ is the filter transfer function for either channel and BW is the effective bandwidth. Consequently, the variance of the phase in Eqn. (30) becomes:

$$\sigma_\phi^2 = \frac{N_o BW}{A^2} \quad (33)$$

Substituting the above Eqn. (28) in Eqn. (33) gives:

$$\sigma^2 = \frac{(R + 1)N_o BW}{A^2} \quad (34)$$

The accuracy of the dispersive-phase can now be determined using Eqn. (1) as:

$$\phi_o = \frac{1.6(R + 1)}{\sqrt{\frac{A^2}{N_o BW}}} \quad (35)$$

This equation allows a desired error in the dispersive-phase of a potential system to be related to a required value for the signal to noise ratio. It is an important engineering constraint for determining the resolution limit which can be achieved in all applications of harmonic coherency.

The second fundamental property of harmonic coherency, the maximum differential time delay which can be tolerated between the separate signals (harmonics), is governed by the method chosen for generating the separate signals. In one potential method, an oscillator is phase-locked to the second harmonic of a signal given by the equation $$z_1(t) = Re \{n(t)e^{j\theta}e^{j\omega_0 t}\}$$

to obtain:

$$z_2(t) = Re \{m(t^2)e^{j\Psi(\omega_0, \omega_0', \omega_0'', \ldots)} e^{j2\theta}e^{j2\omega_0 t}\} \quad (36)$$

where $\Psi$ is a time varying probabilistic phase due to the tracking error of the phase-locked loop which results from the AM and FM noise associated with the two sources. If $z_1(t)$ and $z_2(t)$ are differentially delayed, a deterministic dispersive phase relationship will result only for a delay less than the autocorrelation interval of $\Psi$; $R_\Psi(t)$.

A second alternative method generates the second harmonic of the modulated source by means of a non-linear two port:

$$z_3(t) = Re \{m(t^2)e^{j2\theta}e^{j2\omega_0 t}\} \quad (37)$$

If $z_1(t)$ and $z_3(t)$ are differentially delayed, a deterministic dispersive phase relationship will now result for any delay less than the autocorrelation interval of $m(t^2)$; $R_{m(t^2)}(\tau)$. Since typically $R_{m(t^2)}(\tau) >> R_\Psi(\tau)$, frequency diverse coherent signals capable of much larger differential time delays can be generated by the non-linear two port rather than by the phase-locked loop.

The above two properties of maximum dispersive-phase resolution and maximum differential time delay provide constraints on all applications of harmonic coherency. One such application is the dispersive-phase measurement system which measures the dispersive-phase and dispersive-loss of a target in order to determine its thickness.

Figure 2:
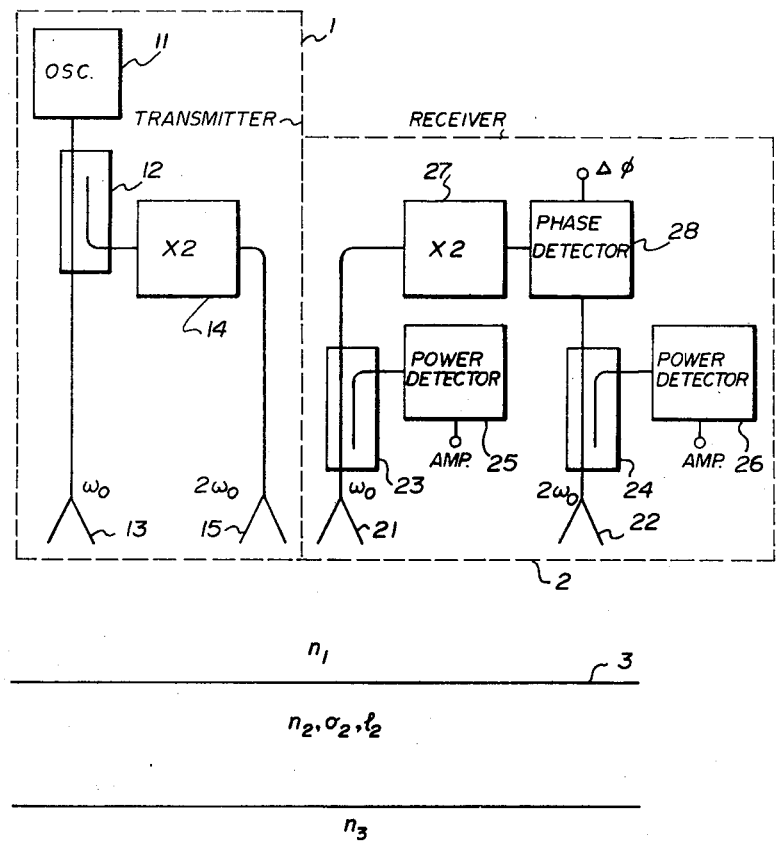
FIG. 2 schematically illustrates a bi-frequency remote sensing apparatus for reflective thickness measurement of a single layer target.

In FIG. 1, the functional block diagram of such a system is illustrated as a bi-frequency transmission remote sensing apparatus for resolving the two dielectric interfaces of a target, while in FIG. 2, the functional block diagram of the system is illustrated as a bi-frequency reflective remote sensing apparatus.

Both systems include a transmitter 1, a receiver 2 for measuring the thickness of a layer or target 3 of dielectric material. The transmitter 1 has an oscillator 11 which generates a signal having a frequency $\omega_0$ ranging from 5 MHz upwards depending on the application of the system which will be discussed later. The oscillator 11 output signal is used to generate the sensing frequencies for the transmitter 1 and in these figures is coupled to a power splitter 12 to provide a signal in two frequency channels. The signal in the first channel is coupled to a first antenna 13 for transmission to the target 3 at the frequency $\omega_0$. The signal in the second channel is coupled to a frequency multiplier 14 where the frequency of signal is doubled to provide a second signal harmonically related to the signal in the first channel. This second signal is coupled to a second antenna 15 for transmission to the target 3 at the frequency $2\omega_0$. Though for simplicity, harmonically related first and second signals are described, this need not be the case. However, the two signals should be derived from the same source and in order to maintain signal errors at a minimum and to simplify the generation of the output signals and their reconversion to a single frequency in the receiver, it is preferred that the frequency ratio be a whole number ratio such as 2/1 or 3/2.

After the signals of frequency $\omega_0$ and $2\omega_0$ traverse the target 3 (FIG. 1) or are reflected from the second interface (FIG. 2), they are received in two frequency channels of the receiver 2 via antenna 21 and 22 respectively. The two channels each include a power splitter 23 and 24 and a power detector 25 and 26 to measure the amplitude of the signals. The received signals are then converted to a single common frequency. To achieve this, the signal of frequency $\omega_0$ is coupled to a frequency multiplier 27 to double its frequency. The output from the multiplier 27 is coupled to a phase comparator 28 together with the signal from the second channel to detect the phase difference.

Figure 3:
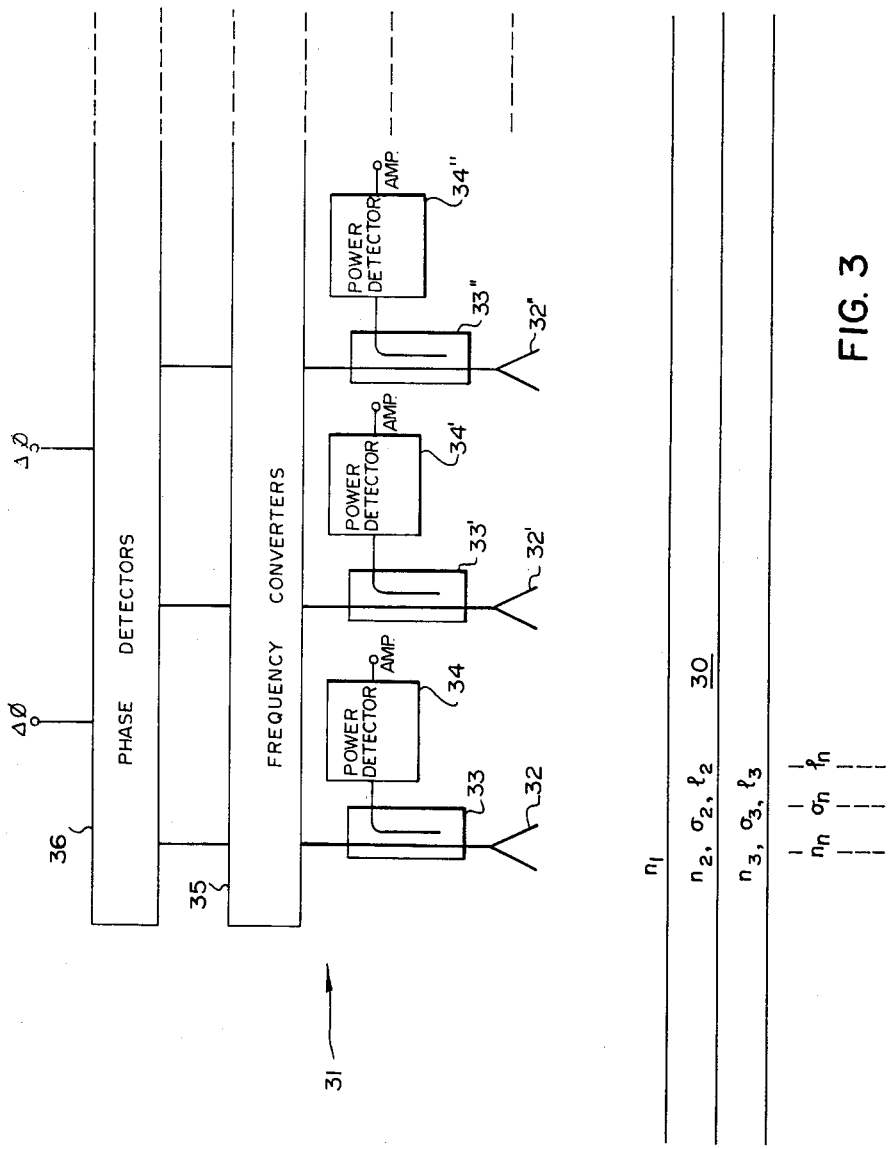
FIG. 3 schematically illustrates the receiver for a multi-frequency remote sensing apparatus for thickness measurement of a multi-layer target.

For a multilayered target 30 of the type shown schematically in FIG. 3, the transmitter is similar to the transmitter described with respect to FIGS. 1 and 2 except that it generates one additional frequency for each additional layer in the target; for a two layer target, three frequency signals are generated; for a three layer target, four frequency signals are generated; etc. As with respect to FIGS. 1 and 2, the frequencies whether three or more are related and may be harmonically related. The receiver 31 includes antennas 32, 32', 32", . . . for receiving each of the transmitted frequencies, though a number of antennas are shown, one antenna with appropriate bandpass filters may be utilized to isolate each frequency. Each received frequency signal is coupled to respective power splitters 33, 33', 33", . . . and detectors 34, 34', 34", . . . to measure their amplitudes. The frequency signals are then coupled to frequency converters 35 where they are converted to a single common frequency. The frequency converter 35 may include frequency dividers or multipliers whereby two or more of the frequency signals are converted to the same frequency as one of the frequency signals, or they may all be converted to a different frequency entirely. The converted frequency signals are then coupled to phase detectors 36 to provide a number of phase difference outputs equal to the number of layers. For a three or more layer target, the phase difference need not be with a common frequency signal, i.e. the phase differences between the first and second, second and third, and third and fourth signals may be detected.

Figure 4:
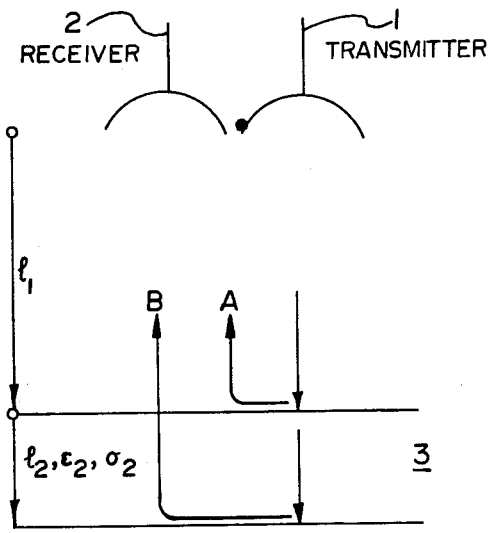
FIGS. 4a, 4b and 4c illustrate signal reflections from a target and their phase relation.
Figure 4:
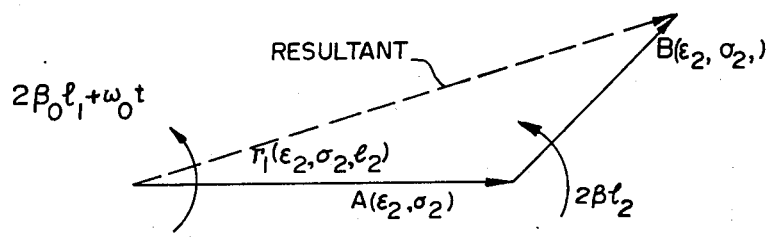
Figure 4:
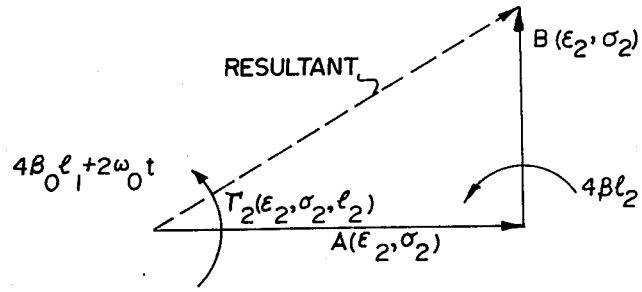

The relationship between the phase measurement and the physical characteristics of a layer may be roughly determined from a consideration of the return signals A and B from two dielectric interfaces illuminated by the two harmonically related CW signals of the continuous wave phase measurement system, each having a transmitter 1 and receiver 2 as shown in FIG. 4a. Assuming for the moment that no multiple reflections occur, the absolute-phases at the receiver for both the fundamental and second harmonic CW signals are shown in FIGS. 4b and 4c respectively, and can be written:

$$Ph_1 = 2\beta l_1 + \omega_0 t + \Gamma_1(\epsilon_2, \sigma_2, l_2) \qquad (38)$$

$$Ph_2 = 4\beta l_1 + 2\omega_0 t + \Gamma_2(\epsilon_2, \sigma_2, l_2) \qquad (39)$$

where
 $\beta$ = propagation constant
 $\omega_0$ = angular frequency in rad/sec.
 $t$ = time in sec.

If each of these phase responses are measured and the dispersive-phase is obtained, i.e. twice the phase of the fundamental CW signals is subtracted from the phase of the second harmonic CW signal, the dispersive-phase is found to be completely independent of time and distance to the target, and is only a function of the dielectric constant $\epsilon_2$, the conductivity $\sigma_2$ and the thickness $l_2$ of the dielectric layer:

$$Ph_2 - 2Ph_1 = \Gamma_2(\epsilon_2, \sigma_2, l_2) - 2\Gamma_1(\epsilon_2, \sigma_2, l_2) \qquad (40)$$

Since $\epsilon_2$ and $\sigma_2$ are known apriori for most applications such as the measurement of ice layers, industrial film or sheet thicknesses, a function $Ph_2 - 2Ph_1$ involving only $l_2$ is obtained.

Similarly, if both of the absolute-losses are measured and the dispersive-loss is obtained, i.e. their ratio is taken, the dispersive-loss is found to be independent of time and distance to the target, and is a function only of $\epsilon_2$, $\sigma_2$, and $l_2$. Again, since $\epsilon_2$ and $\sigma_2$ are known apriori, a function involving only $l_2$ is left.

These two functions for the dispersive-phase and dispersive-loss are each single valued over an interval of $l_2$ corresponding to $\lambda/4$ of the difference signal of the two harmonics. Since these functions will also resolve each other, this interval can be extended to an unambiguous thickness corresponding to $\lambda/2$.

The mathematical relationship between the dispersive-phase and dispersive-loss measurements and the physical characteristics of the dielectric layers can be described rigorously as follows. Assuming two uniform plane waves incident at the target, the Fresnel reflection coefficient for each frequency is:

$$\frac{E_r}{E_i} = Re\left\{ \frac{\left(\frac{1-\xi_2}{1+\xi_2}\right)\left(\frac{\xi_2+\xi_3}{\xi_2-\xi_3}\right) + e^{-2\gamma_2 l_2}}{\left(\frac{1+\xi_2}{1-\xi_2}\right)\left(\frac{\xi_2+\xi_3}{\xi_2-\xi_3}\right) + e^{-2\gamma_2 l_2}} \right\} \qquad (41)$$

where
 $E_r$ = reflected electric field intensity in region 1 at $z = 0$.
 $E_i$ = incident electric field intensity in region 1 at $z = 0$.

$$\xi_j = \frac{\eta_1}{\eta_j} = \sqrt{\frac{\epsilon_{r_j}}{\epsilon_{r_1}}} \quad ; j = 1, 2 \qquad (42)$$

$$\gamma_2 = \frac{\sigma_2 n_1}{2\xi_2} + j\frac{\omega \xi_2}{\nu} \qquad (43)$$

$n_j$ = characteristic impedance of medium $j$
$\epsilon_{r_j}$ = relative dielectric constant of medium $j$
$\sigma_j$ = electrical conductivity of medium $j$
$l_j$ = physical thickness of medium $j$
$\omega$ = angular frequency in rad/sec
$\nu$ = free space velocity of light Letting:

$$A = \frac{1+\xi_2}{1-\xi_2}$$

$$B = \frac{\xi_2+\xi_3}{\xi_2-\xi_3}$$

$$C = \frac{\sigma_2 n_1}{2\xi_2}$$

and transforming $E_i$ and $E_r$ to a reference plane at $z = -l_1$ (the plane of the radar sensor), the received signal becomes:

$$E_r = Re\left\{ E_{i_1}\left[\frac{\frac{B}{A} + e^{-2(C+j\frac{\omega_0}{\nu}\xi_2)l_2}}{AB + e^{-2(C+j\frac{\omega_0}{\nu}\xi_2)l_2}}\right] e^{j\left[\theta - \frac{2\omega_0}{\nu}l_1\right]} e^{j\omega_0 t} + \right. \qquad (44)$$

$$\left. E_{i_2}\left[\frac{\frac{B}{A} + e^{-4(C+j\frac{\omega_0}{\nu}\xi_2)l_2}}{AB + e^{-4(C+j\frac{\omega_0}{\nu}\xi_2)l_2}}\right] e^{j\left[2\theta - \frac{4\omega_0}{\nu}l_1\right]} e^{j2\omega_0 t} \right\}$$

Adding narrow band noise, normalizing independently the complex envelopes of each harmonic and considering the near field phase factors, we have:

$$E_r = Re\left\{ [1 + x_1(t) + jy_1(t)] e^{j\left[\Gamma_1 + \theta - \frac{2\omega_0}{\nu}l_1 + 2\tan^{-1}\left(\frac{\omega_0 l_1}{\nu} - \frac{\nu}{\omega_0 l_1}\right)\right]} e^{j\omega_0 t} + \right. \qquad (45)$$

$$\left. [1 + x_2(t) + jy_2(t)] e^{j\left[\Gamma_2 + 2\theta - \frac{4\omega_0}{\nu}l_1 + 2\tan^{-1}\left(\frac{2\omega_0 l_1}{\nu} - \frac{\nu}{2\omega_0 l_1}\right)\right]} e^{j2\omega_0 t} \right\}$$

where $$\Gamma_1 = \tan^{-1}\left\{\frac{e^{-2Cl_2}\sin\left(-\frac{2\omega_0}{v}\xi_2 l_2\right)}{\frac{B}{A} + e^{-2Cl_2}\cos\left(-\frac{2\omega_0}{v}\xi_2 l_2\right)}\right\} - \tan^{-1}\left\{\frac{e^{-2Cl_2}\sin\left(-\frac{2\omega_0}{v}\xi_2 l_2\right)}{AB + e^{-2Cl_2}\cos\left(-\frac{2\omega_0}{v}\xi_2 l_2\right)}\right\} \quad (46)$$

and $$\Gamma_2 = \tan^{-1}\left\{\frac{e^{-4Cl_2}\sin\left(-\frac{4\omega_0}{v}\xi_2 l_2\right)}{\frac{B}{A} + e^{-4Cl_2}\cos\left(-\frac{4\omega_0}{v}\xi_2 l_2\right)}\right\} - \tan^{-1}\left\{\frac{e^{-4Cl_2}\sin\left(-\frac{4\omega_0}{v}\xi_2 l_2\right)}{AB + e^{-4Cl_2}\cos\left(-\frac{4\omega_0}{v}\xi_2 l_2\right)}\right\} \quad (47)$$

Here, the stochastic characteristic functions, $S(\omega)$ for each normalized noise component $x_1, y_1, x_2, y_2$, are related by:

$$S_{x_1}(\omega) = S_{y_1}\omega \quad (48)$$

and $$S_{x_2}(\omega) = S_{y_2}(\omega) \quad (49)$$

Assuming the noise power is much smaller than the signal and letting:

$$2\tan^{-1}\left(\frac{\omega_0 l_1}{v} - \frac{v}{\omega_0 l_1}\right) \approx \pi - \frac{2v\omega_0 l_1}{\omega_0^2 l_1^2 - v^2}; l_1 > \frac{\lambda_0}{2} \quad (50)$$

$$\approx \pi - \sum_{n=0}^{\infty}\left(\frac{v}{\omega_0 l_1}\right)^{2n+1}; l_1 > \frac{\lambda_0}{2}$$

$$\approx \pi - \left(\frac{2v}{\omega_0 l_1}\right); l_1 > \frac{\lambda_0}{2}$$

and $$2\tan^{-1}\left(\frac{2\omega_0 l_1}{v} - \frac{v}{2\omega_0 l_1}\right) \approx \pi - \left(\frac{v}{\omega_0 l_1}\right); l_1 > \frac{\lambda_0}{4} \quad (51)$$

we have $$E_r \approx Re\left\{e^{j\left[y_1(t) + \Gamma_1 + \theta - 2\frac{\omega_0 l_1}{v} + \pi - \frac{2v}{\omega_0 l_1}\right]}e^{j\omega_0 t} + \right. \quad (52)$$

$$\left. e^{j\left[y_2(2) + \Gamma_2 + 2\theta - \frac{4\omega_0 l_1}{v} + \pi - \frac{v}{\omega_0 l_1}\right]}e^{j2\omega_0 t}\right\};$$

$$l_1 > \frac{\lambda_0}{2}$$

Upon reception, the fundamental frequency of this signal is applied to a frequency doubler 27 as shown in FIG. 2 to give:

$$V(t) = M Re\left\{e^{j2\left[y_1(t) + \Gamma_1 + \theta - \frac{2\omega_0 l_1}{v} + \pi - \frac{2v}{\omega_0 l_1}\right]}e^{j2\omega_0 t}\right\}; \quad (53)$$

$$l_1 > \frac{\lambda_0}{2}$$

where M is the mixing conversion loss factor. This voltage and the second harmonic wave have the same frequency and are phase coherent. Consequently, they can be compared in phase and in phase quadrature using the phase detector 28 to give the following detected DC voltages:

$$V_1(t) = M M_1 Re\left\{e^{j\left[y_2(t) - 2y_1(t) + \Gamma_2 - 2\Gamma_1 - \pi + \frac{3v}{\omega_0 l_1}\right]}\right\} \quad (54)$$

$$V_2(t) = M M_2 I_m\left\{e^{j\left[y_2(t) - 2y_1(t) + \Gamma_2 - 2\Gamma_1 - \pi + \frac{3v}{\omega_0 l_1}\right]}\right\} \quad (55)$$

where $M_1$ and $M_2$ are the conversion losses. Assuming $y_1(t)$ and $y_2(t)$ have zero means and are statistically independent, wide sense stationary and ergodic, we can integrate $V_1(t)$ and $V_2(t)$ over T to obtain:

$$\overline{V}_1 = M M_1 Re\left\{e^{j\left[y_2(t) - 2y_1(t) + \Gamma_2 - 2\Gamma_1 - \pi + \frac{3v}{\omega_0 l_1}\right]}\right\} \quad (56)$$

$$= M M_1 Re\left\{e^{j\left[\Gamma_2 - 2\Gamma_1 - \pi + \frac{3v}{\omega_0 l_1}\right]}\right\}$$

and

-continued $$\overline{V}_2 = M M_2 I_m \left\{ e^{\left[ \Gamma_2 - 2\Gamma_1 - \pi + \frac{3v}{\omega_0 l_1} \right]} \right\} \quad (57)$$

Combining these two equations, we have:

$$\Gamma_2 - 2\Gamma_1 = \tan^{-1}\left( \frac{\overline{V}_2}{\overline{V}_1} \frac{M_1}{M_2} \right) + \pi - \frac{3v}{\omega_0 l_1} \quad (58)$$

which relates the detected DC voltages to the physical characteristics of the target contained in functions $\Gamma_1$ and $\Gamma_2$.

For airborn measurement applications, the phase term arising from the near field consideration $3v/\omega_0 l_1$, approaches zero for $l_1 > 10v$. This leaves the measurement completely independent of the distance to the target and makes any motion compensation circuitry unnecessary. For surface measurement applications, this phase term along with the $\pi$ term constitute a system parameter which is accounted for in ground truth alignments.

For specified values of A, B and C, $\overline{V}_2/\overline{V}_1$ is single valued over an interval of approximately $\xi_2 l_2 = \pi/4$. This ambiguity interval can be extended to $\xi_2 l_2 = \pi/2$ with the additional information obtained from the ratio of the time averaged electric field intensities at each frequency, $V_3$ and $V_4$. From the radar range equation, we have:

$$\frac{\overline{V}_3 \overline{V}_6}{\overline{V}_4 \overline{V}_5} = \frac{M_3 M_6}{M_4 M_5} \left( \frac{\frac{P_{R_1}}{P_{T_1}}}{\frac{P_{R_2}}{P_{T_2}}} \right) = \frac{G_1}{G_2} \left( \frac{\frac{c}{2\omega_0 l_0}}{\frac{c}{4\omega_0 l_0}} \right)^2 \left| \frac{\Gamma_1}{\Gamma_2} \right|^2 \quad (59)$$

$$= 4 \frac{G_1}{G_2} \left| \frac{\Gamma_1}{\Gamma_2} \right|^2 \quad (60)$$

$$= 4 \left( \frac{G_1}{G_2} \right) \frac{Re\left\{ \frac{\frac{B}{A} + e^{2\left[ c + j\frac{\omega_0}{v} \xi_2 \right] l_2}}{AB + e^{2\left[ c + j\frac{\omega_0}{v} \xi_2 \right] l_2}} \right\}^2}{Re\left\{ \frac{\frac{B}{A} + e^{-4\left[ c + j\frac{\omega_0}{v} \xi_2 \right] l_2}}{AB + e^{4\left[ c + j\frac{\omega_0}{v} \xi_2 \right] l_2}} \right\}} \quad (61)$$

$$l_1 > \frac{\lambda_0}{2}$$

Figure 5A:
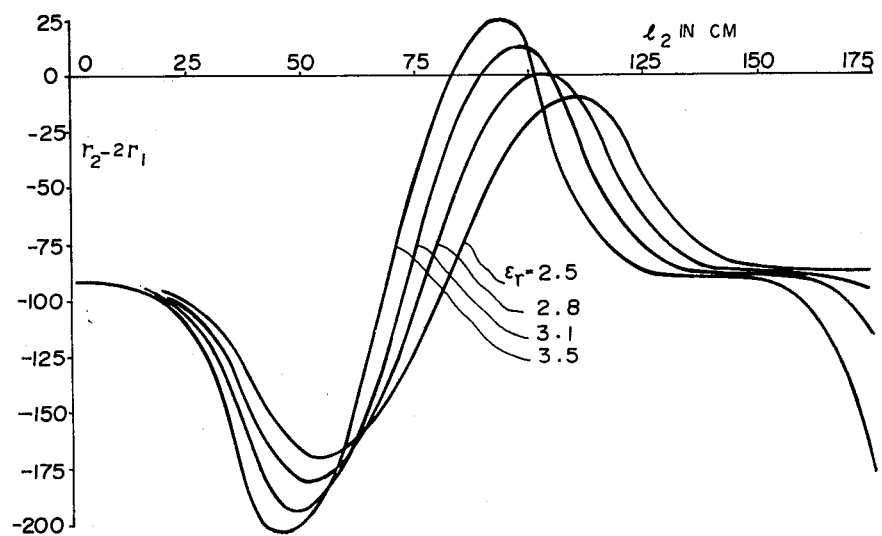
FIGS. 5a and 5b are graphs for phase difference vs thickness and amplitude ratio vs thickness respectively, for a 58 MHz and 116 MHz bi-frequency ice thickness measurement system.
Figure 5B:
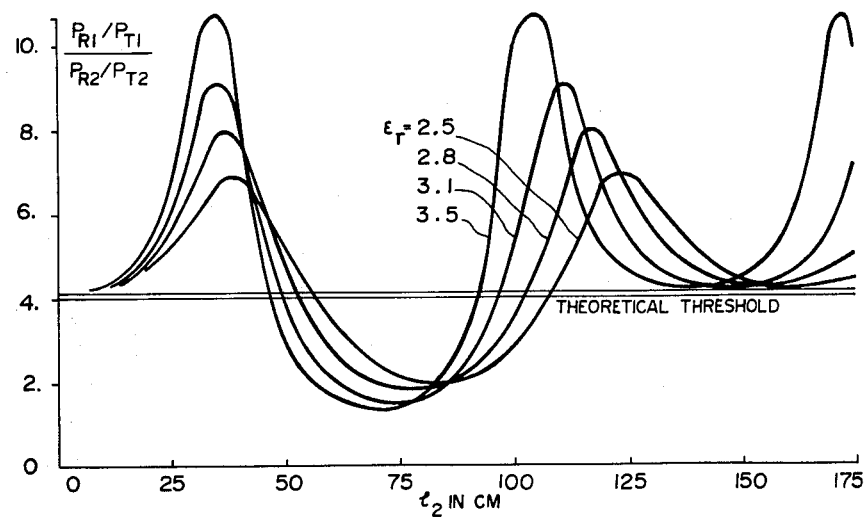

Plots of $\Gamma_2 - 2\Gamma_1$ versus $l_2$ and of $$\frac{P_{R_1}}{P_{T_1}}$$
$$\frac{P_{R_2}}{P_{T_2}}$$

versus $l_2$ for various values of dielectric constant $\epsilon_{r_2}$ and for conductivity $\sigma_2 = 0$ and frequency $\omega_0/2\pi = 58$ MHz are given in FIGS. 5a and 5b. This data represents the situation encountered by a 58 MHz and 116 MHz bi-frequency radar used to measure the thickness of ice.

In a similar manner the relationship between the spatial interferometric measurements and the physical characteristics of dielectric layers may be determined for apparatus which makes transmission measurements as in FIG. 1 instead of reflection measurements as in FIG. 2. The relationships are very similar to those defined by equations 58 and 61 except that the constants change.

The thickness of a target composed of multiple layers can be determined using an extension of the above technique. For example, for a target which consists of two layers of thickness $l_2$ and $l_3$, a third harmonic must be added and its insertion phase $\Gamma_3$ compared with $3\Gamma_1$ in a similar manner to equation 58. Also its amplitude must be compared with the fundamental amplitude in a manner similar to equation 61. Since $\Gamma_3 - 3\Gamma_1$ and the amplitude ratio of the third harmonic to the fundamental will be functions of $l_2$ and $l_3$ (similar to equations 58 and 61) they can be combined with $\Gamma_2 - 2\Gamma_1$ and the amplitude ratio of the second harmonic to the fundamental to obtain $l_2$ and $l_3$. For a target consisting of three layers, a similar argumentation leads to the use of four harmonics, and so on.

Figure 6A:
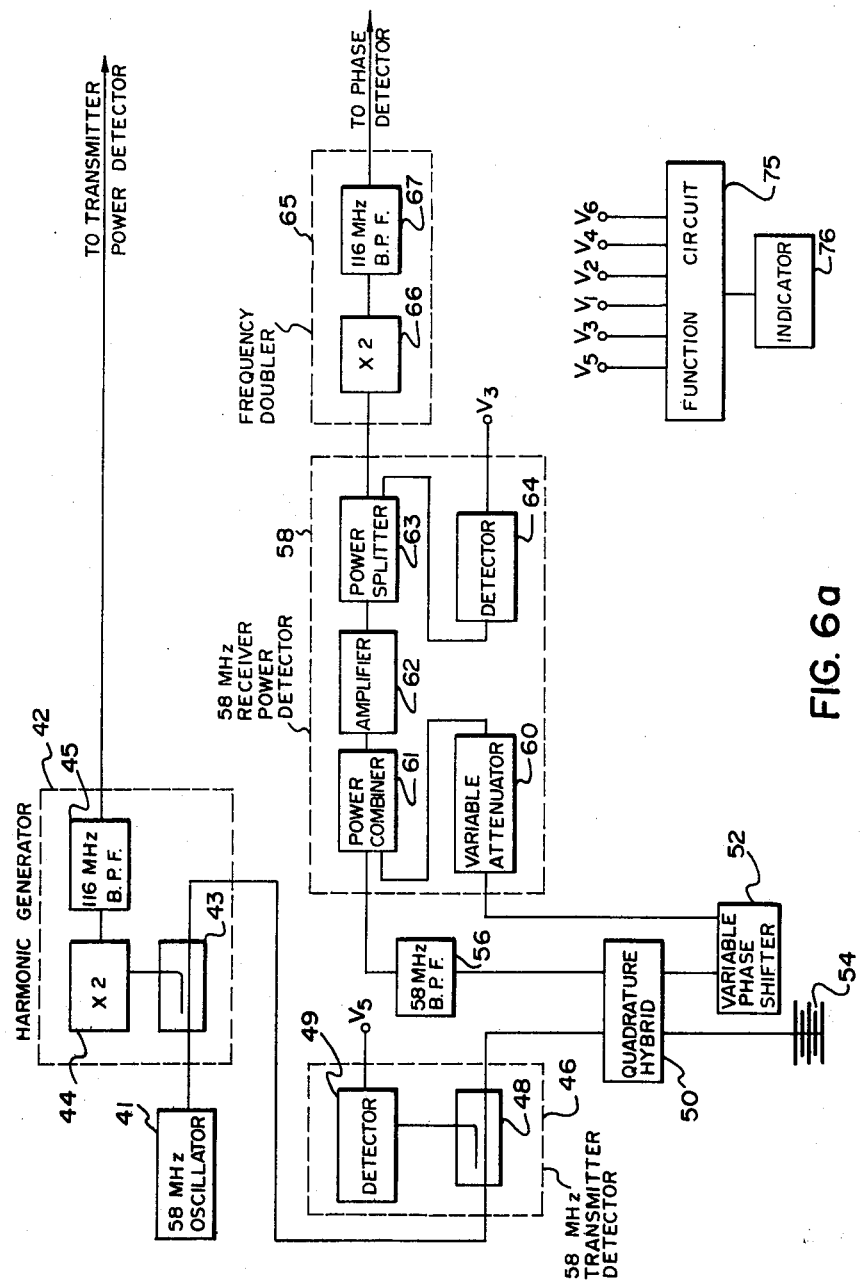
FIGS. 6a and 6b illustrate an embodiment of the bi-frequency remote sensing apparatus for ice thickness measurement in accordance with this invention.
Figure 6B:
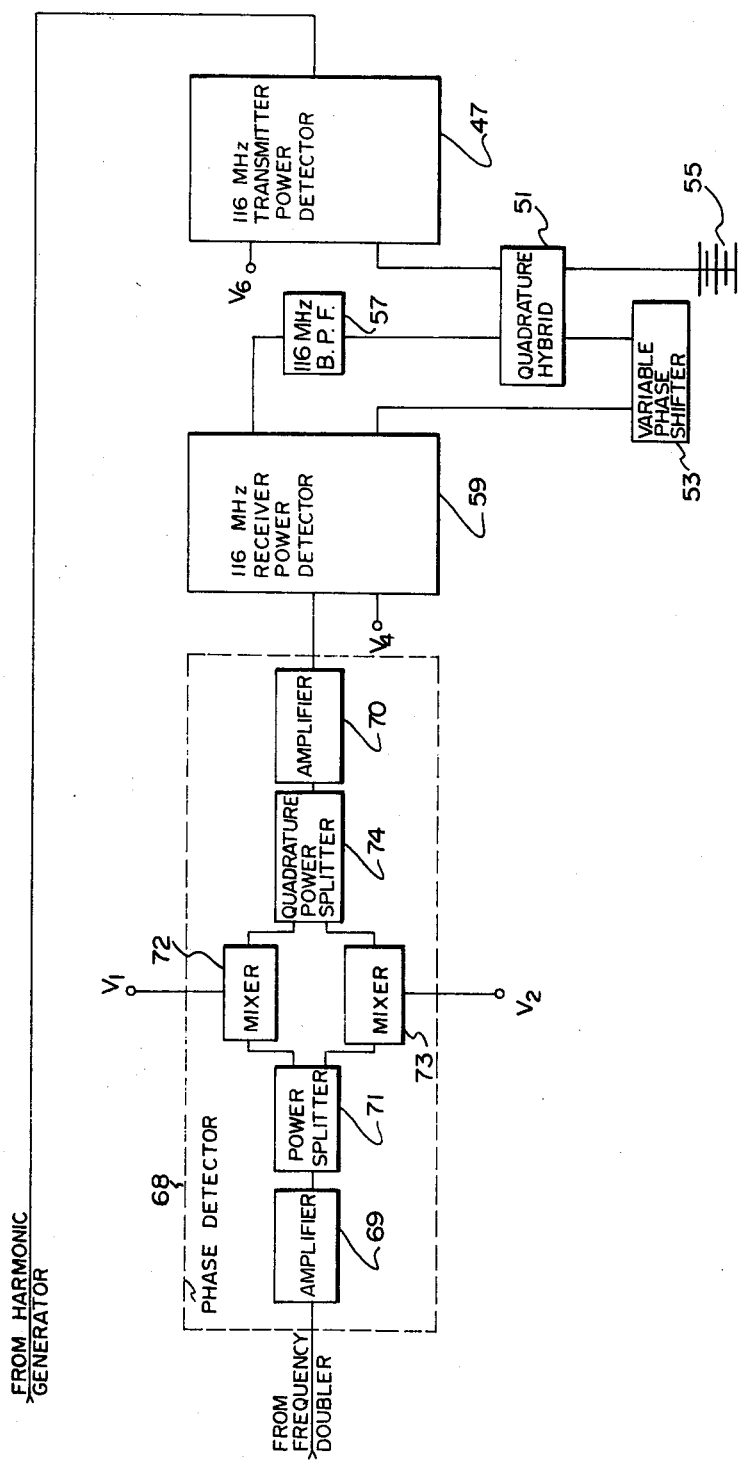

FIGS. 6a and 6b taken together illustrate a system block diagram of a 58 MHz and 116 MHz apparatus constructed for measuring the dispersive-phase and dispersive-loss introduced by reflections from an ice sheet. This system includes amplifiers, attenuators and filters, and two resonant phase cancellation networks required to isolate the transmitter and receiver and to reduce the space requirements of the radiating elements. More specifically, a 58 MHz oscillator 41 feeds a harmonic generator circuit 42 which includes a power splitter 43, a multiplier circuit 44 coupled to one output of the splitter 43 and a 116 MHz bandpass filter 45 at the output of the multiplier 44. The 58 MHz and the 116 MHz output signals from the harmonic generator 42 are coupled to transmitter power detectors 46 and 47 respectively. Each transmitter power detector having a power splitter 48 and a detector 49 which produce voltage $V_5$ and $V_6$ representing the power levels of the respective transmitted signals. The output from transmitter power detectors 46, 47 are fed to respective quadrature hybrid circuits 50, 51 where they are split between control paths including variable phase shifters 52, 53 and respective radiating elements or antennas 54, 55 for radiation towards the target.

Return signals from the target are received with the same antennas 54, 55 used by the transmitter and are fed through the quadrature hybrids 50, 51 and narrow band, noise suppressing bandpass filters 56, 57, to similar receiver power detector circuits 58, 59, bandpass filters 56 and 57 being 58 MHz and 116 MHz respectively. Antenna reflections which are also fed to the receiver power detectors 58, 59, are suppressed to typically $-50$ dB by adjustments of the variable phase shifters 52, 53, and a variable attenuator 60 located in each receiver power detector circuit 58, 59, in the control path. Resonator phase cancellation is then achieved by combining the control signal with antenna reflections and the received signal in power combiner 61. This signal is amplified through amplifier 62, split in power splitter 63 which provides one output signal to detector 64 and a second output signal. Thus receiver power detectors 58, 59, provide voltage $V_3$ and $V_4$ representing the power levels of respective received signals.

The output from the 58 MHz receiver power detector 58 is fed to a frequency doubler 65 which includes a multiplier circuit 66 and a 116 MHz bandpass filter 67. The 116 MHz output from doubler 65 is then fed along with the output from the 116 MHz receiver power detector 57 to a phase detector 68. Phase detector 68 includes a first amplifier 69 coupled to doubler 65 and a second amplifier 70 coupled to receiver power detector 59. Amplifier 69 feeds an in phase power splitter 71 which has a first output coupled to a mixer 72 and a second output coupled to a mixer 73. Amplifier 70 feeds a quadrature power splitter 74 which has a first output coupled to the mixer 72 and a second output coupled to the mixer 73. Mixers 72 and 73 provide output voltages $V_1$ and $V_2$ respectively representing the phase of the received signals.

The phase signals $V_1$ and $V_2$ and the power level signals $V_3$, $V_4$, $V_5$ and $V_6$ are coupled to a voltage function circuit 73 where they are processed to determine the relative phase between the received signals and consequently the dispersive-phase of the target, as well as the dispersive-loss of the target, thereby indicating the thickness of the target layer on the indicator 76.

The theoretical data presented earlier in FIGS. 5a and 5b represent the situation encountered by the 58 MHz and 116 MHz bi-frequency radar used to measure the thickness of ice. For fresh water ice, the dielectric constant is equal to $3.18 \pm 2\%$ and as a result the data for $\epsilon_r = 3.2$ can be used in FIGS. 5a and 5b with negligible error. Also, perturbations introduced in the data due to non-zero conductivity of fresh water ice are small; less than 1% in FIG. 5a and less than 2% in FIG. 5b, and consequently, the effect of any uncertainty can be ignored. The phase detector 68 (FIG. 6b) is used to precisely measure the dispersive-phase $\Gamma_2 - 2\Gamma_1$ of the ice layer from which the two possible thickness values can be determined from FIG. 5a. The 58 MHz and 116 MHz transmitter and receiver power detector voltages are then used with FIG. 5b to approximately determine the dispersive-loss, of the ice layer, in order to resolve which of these thickness values represents the actual ice depth.

Ground based field tests were conducted with the above system. These tests resulted in the data in table I.

In the first column, the mean value for the dispersive-phase accounting for the calibration offset as well as the spread for each measurement is shown. The two possible thickness values for the ice, as determined by FIG. 5a with $\epsilon_r = 3.2$, are given in the second column. The approximate value of the dispersive-loss is given in the third column and is used to resolve between the two possible thicknesses by comparing its value with the experimentally obtained threshold of 3.8. The selected value for the ice thickness is given in column four. Ground truth thickness obtained by drilling up to eight cores over a twelve foot by twelve foot target area beneath the antenna is presented in column five.

TABLE I

Fresh water ice thickness data obtained with a bi-frequency radar ($\frac{\omega_0}{2\pi} = 58$ MHz).

| $\Gamma_2 - 2\Gamma_1$ | Possible Calculated Values For $l_2$ | $\frac{P_{R1}}{P_{T1}}$ $\frac{P_{R2}}{P_{T2}}$ (Experimental Threshold = 3.8) | Deduced Value For $l_2$ | Ground Truth Value For $l_2$ |
|---|---|---|---|---|
| $-181\pm1°$ | $40\pm.3$cm $57\pm.3$cm | 2.6 | $57\pm.3$cm | $53\pm2$cm |
| $-178\pm1°$ | $40\pm.3$cm $58\pm.3$cm | 3.0 | $58\pm.3$cm | $53\pm2$cm |
| $-175\pm3°$ | $39\pm.7$cm $58\pm.7$cm | 2.4 | $58\pm.7$cm | $53\pm2$cm |
| $-172\pm1°$ | $38\pm.3$cm $59\pm.3$cm | 2.2 | $59\pm.3$cm | $57\pm4$cm |
| $-114\pm3°$ | $28\pm1.$cm $69\pm.5$cm | 2.0 | $69\pm.5$cm | $62\pm5$cm |
| $-112\pm3°$ | $27\pm1.$cm $69\pm.5$cm | 2.0 | $69\pm.5$cm | $62\pm5$cm |
| $-119\pm3°$ | $29\pm1.$cm $68\pm.5$cm | 2.0 | $68\pm.5$cm | $64\pm5$cm |
| $-123\pm3°$ | $30\pm1.$cm $67\pm.5$cm | 2.2 | $67\pm.5$cm | $64\pm5$cm |

Further thickness measurements were taken of plexiglass over a metal sheet where $\epsilon_r = 2.6$ at 4 GHz as a simulation oil films on water where $\epsilon_r = 2.2$ at 4 GHz, using a C-band bi-frequency system of frequencies 4 GHz and 8 GHz. The data obtained for various thicknesses of plexiglass is given in Table II.

TABLE II

Plexiglass over a metal sheet ($\frac{\omega_0}{2\pi} = 4$ GHz)

| $\Gamma_2 - 2\Gamma_1$ | Possible Calculated Values for $l_2$ | $\frac{P_{R1}}{P_{T1}}$ $\frac{P_{R2}}{P_{T2}}$ Experimental Threshold = 4.3 | Deduced Value For $l_2$ | Measured Value For $l_2$ |
|---|---|---|---|---|
| $-91.4°$ | 1.8 mm 11.6 mm | 4.3 | 1.8 mm | 1.6 mm |
| $-126.0°$ | 5.0 mm 10.5 mm | 5.8 | 5.0 mm | 5.0 mm |
| $-174.6°$ | 7.5 mm 7.5 mm | — | 7.5 mm | 6.0 mm |
| $-165.4$ | 6.7 mm 9.0 mm | 4.3 | 9.0 mm | 10.0 mm |
| $-83.4°$ | 12.0 mm 20.25 mm | 3.7 | 12.0 mm | 13.0 mm |
| $-76.2°$ | 12.1 mm 19.5 mm | 9.8 | 19.5 mm | 20.0 mm |

We claim:

1. Apparatus for the remote measurement of the thickness of $n$ layers in a dielectric target where $n \geq 1$, comprising:
   transmitter means having $n + 1$ single frequency channels for directing $n + 1$ related frequency signals to the target; and
   receiver means for receiving the $n + 1$ signals from the target, said receiver means including first means for converting the signals to a common frequency and second means for comparing the phase of pairs of the converted signals for determining the thicknesses $l$ of the $n$ layers as a function of the phase differences where $l < \lambda/4$, $\lambda$ being the shortest wavelength of the difference frequency between the related $n + 1$ signals.

2. Apparatus as claimed in claim 1 wherein said receiver further includes third means for detecting the amplitudes of the received signals for determining the thicknesses l of the $n$ layers as a function of amplitude ratios of the received signals, where $l < \lambda/2$.

3. Apparatus as claimed in claim 2 wherein the frequency of each of the $n + 1$ signals is greater than 5 MHz.

4. Apparatus as claimed in claim 1 wherein the second means includes $n$ phase comparing means each having a first input coupled to a common one of the converted signals and each having a second input coupled to a different one of the converted signals.

5. Apparatus as claimed in claim 1 wherein the transmitter means includes oscillator means for generating a signal having a fundamental frequency $f$ and harmonic generator means coupled to the oscillator means for generating $n$ harmonic signals.

6. Apparatus as claimed in claim 5 wherein $n = 1$ and the signals have a frequency $f$ and $2f$.

7. Apparatus as claimed in claim 6 wherein the first means includes multiplier means for multiplying the received signals of frequency $f$ by a factor of 2.

8. Apparatus as claimed in claim 5 wherein the transmitter includes detector means for detecting the amplitude of each of the $n + 1$ transmitted signals.

* * * * *